United States Patent
Kang et al.

(10) Patent No.: US 8,378,686 B2
(45) Date of Patent: Feb. 19, 2013

(54) APPARATUS AND METHOD FOR SENSING BATTERY CELL VOLTAGE USING ISOLATION CAPACITOR

(75) Inventors: Ju-Hyun Kang, Daejeon (KR); Akimov Volodymyr, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/372,111

(22) Filed: Feb. 13, 2012

(65) Prior Publication Data

US 2012/0200252 A1 Aug. 9, 2012

Related U.S. Application Data

(63) Continuation of application No. 12/672,283, filed as application No. PCT/KR2008/004613 on Aug. 8, 2008, now Pat. No. 8,129,995.

(30) Foreign Application Priority Data

Aug. 8, 2007 (KR) .................. 10-2007-0079576

(51) Int. Cl.
- *G01N 27/416* (2006.01)
- *H02J 7/00* (2006.01)
- *H02J 7/04* (2006.01)
- *H02J 7/16* (2006.01)

(52) U.S. Cl. ........ 324/426; 324/429; 324/433; 320/132; 320/134; 320/162

(58) Field of Classification Search .................. 320/166; 324/426

See application file for complete search history.

(56) References Cited

U.S. PATENT DOCUMENTS

| 6,157,165 A * | 12/2000 | Kinoshita et al. ............. 320/116 |
| 6,307,378 B1 | 10/2001 | Kozlowski |
| 6,472,880 B1 | 10/2002 | Kang |
| 6,639,409 B2 * | 10/2003 | Morimoto et al. ............ 324/434 |
| 8,004,249 B2 | 8/2011 | Lim et al. |
| 2007/0046260 A1* | 3/2007 | Ishikawa ........................ 320/124 |

FOREIGN PATENT DOCUMENTS

| JP | 2003-084015 | * | 3/2003 |
| JP | 2003-84015 A | | 3/2003 |
| KR | 10-1997-002323 A | | 5/1997 |

* cited by examiner

*Primary Examiner* — Edward Tso
*Assistant Examiner* — Ahmed Omar
(74) *Attorney, Agent, or Firm* — Birch, Stewart, Kolasch & Birch, LLP

(57) ABSTRACT

An apparatus for measuring a battery cell voltage includes a battery having a cell group; a first switching unit for selectively connecting both terminals of each battery cell of the cell group to conductive lines; a first voltage charging unit connected between the conductive lines to primarily charge a cell voltage; a second voltage charging unit for relaying the charged voltage in the first voltage charging unit for secondary charging; a cell voltage sensing unit for sensing the voltage charged in the second voltage charging unit; and a second switching unit for interconnecting the voltage charging units in the charged voltage relaying mode and isolating the voltage charging units in the charged voltage sensing mode. This apparatus realizes isolation between a high voltage battery and a voltage sensing unit, thereby allowing voltage sensing of each battery cell included in a high voltage battery using a part with low withstanding voltage.

17 Claims, 4 Drawing Sheets

APPARATUS AND METHOD FOR SENSING BATTERY CELL VOLTAGE USING ISOLATION CAPACITOR

CROSS-REFERENCE TO RELATED APPLICATION

This application is a continuation of U.S. patent application Ser. No. 12/672,283 filed on Feb. 5, 2010 now U.S. Pat. No. 8,129,995, which is a National Stage Entry of PCT/KR08/04613 filed on Aug. 8, 2008, which claims priority under 35 USC 119(a) to Korean Patent Application No. 10-2007-0079576 filed in the Republic of Korea on Aug. 8, 2007, the entire contents of which are incorporated herein by reference.

TECHNICAL FIELD

The present invention relates to apparatus and method for sensing a battery cell voltage of an isolation capacitor, and more particularly to apparatus and method for sensing a battery cell voltage using an isolation capacitor, which may realize a voltage measuring circuit even with a device having a low withstanding voltage by using an isolation capacitor.

BACKGROUND ART

Generally, secondary batteries include a nickel-cadmium battery, a nickel-hydrogen battery, a lithium ion battery, a lithium ion polymer battery and so on. Such secondary batteries are classified into lithium-based batteries and nickel-hydrogen-based batteries. The lithium-based batteries are mainly used for small products such as digital camera, P-DVD, MP3P, cellular phone, PDA, portable game device, power tool and E-bike, while the nickel-hydrogen-based batteries are mainly applied to and used for large products such as electric or hydride vehicles, which require high output.

Meanwhile, an electric or hybrid electric vehicle is operated by driving a high power motor, so a high voltage battery of 100V or above is used. Thus, a high voltage battery used for an electric or hybrid electric vehicle has a plurality of battery cells connected in series or in parallel. The high voltage battery having a plurality of battery cells uses a voltage measuring circuit to periodically measure voltage of each battery cell and thus control charging/discharging of the battery.

FIG. 1 is a circuit diagram showing a conventional battery cell voltage measuring apparatus.

As shown in FIG. 1, the conventional voltage measuring apparatus includes a first switching unit 31 composed of a plurality of switch devices respectively connected to anode and cathode terminals of each battery cell VB1, VB2, VB3, VB4 for sensing voltages at both terminals of each battery cell VB1, VB2, VB3, VB4 included in a cell group 21 of a battery 20 that is connected to a load 10 to supply power thereto, a voltage charging unit 32 charged with the voltage of each battery cell VB1, VB2, VB3, VB4 by means of turning-on operation of the first switching unit 31, and a second switching unit 33 for applying the voltages at both ends of the voltage charging unit 32 to a voltage amplifier 40 by means of its turning-on operation.

However, in the above conventional battery voltage measuring apparatus, the battery 20 is directly connected to a ground to which the load 10 is grounded, while being electrically connected to the load 10. In this connection, in order to measure voltage of each battery cell VB1, VB2, VB3, VB4, the voltage amplifier 40 and the load 10 connected through the first and second switching units 31, 33 are connected to the same ground, so a high voltage corresponding to the entire voltage of the battery is applied to the first and second switching units 31, 33. Thus, switch devices included in the first and second switching units 31, 33 should have high withstanding voltage so as to endure high potential.

A switch device with high withstanding voltage is however expensive, thereby causing increase of production costs of the voltage measuring apparatus. Thus, there is an urgent need in the art for developing a circuit capable of measuring voltage of each battery cell by adopting a device with a low withstanding voltage.

DISCLOSURE OF INVENTION

Technical Problem

The present invention is designed to solve the problems of the prior art, and therefore it is an object of the present invention to provide apparatus and method for measuring a battery cell voltage using an isolation capacitor, which may stably measure voltage of each battery cell included in a high voltage battery by adopting a switching device with a low withstanding voltage.

Technical Solution

In order to accomplish the above object, the present invention provides an apparatus for measuring a battery cell voltage using an isolation capacitor, including a battery having a cell group; a first switching unit for selectively connecting both terminals of each battery cell of the cell group to first and second conductive lines; a first voltage charging unit connected between the first and second conductive lines to primarily charge a cell voltage; a second voltage charging unit for relaying the charged voltage stored in the first voltage charging unit such that the relayed voltage is secondarily charged to the second voltage charging unit; a cell voltage sensing unit for sensing the voltage charged in the second voltage charging unit; and a second switching unit for connecting the first and second voltage charging units with each other in the charged voltage relaying mode and isolating the first and second voltage charging units from each other in the charged voltage sensing mode.

Preferably, the cell voltage sensing unit includes a voltage amplifier for amplifying the voltage charged in the second voltage charging unit to output the amplified voltage as an analog voltage signal; an A/D (Alternating/Direct) converter for receiving the output analog voltage signal to convert the analog voltage signal into a digital voltage signal and output the digital voltage signal; and a controller for receiving the converted digital voltage signal to monitor a voltage of the battery cell, and controlling overall operations of the first and second switching units.

Preferably, the apparatus for measuring a battery cell voltage using an isolation capacitor according to the present invention further includes a first discharging unit selectively connected to the first voltage charging unit to discharge the charged voltage stored in the first voltage charging unit after the charged voltage stored in the first voltage charging unit is completely relayed to the second voltage charging unit.

In the present invention, the first discharging unit may have a discharge resistance connected to the first voltage charging unit through a conductive line and a switch for controlling ON/OFF operation of the discharge resistance.

Preferably, the apparatus for measuring a battery cell voltage using an isolation capacitor according to the present invention further includes a second discharging unit selectively connected to the second voltage charging unit to discharge the charged voltage stored in the second voltage charging unit after the charged voltage is completely sensed.

In the present invention, the second discharging unit may have a discharge resistance connected to the second voltage charging unit through a conductive line and a switch for controlling ON/OFF operation of the discharge resistance.

Preferably, the second voltage charging unit includes first and second capacitors respectively installed on the first and second conductive lines; and first and second switches for turning on/off an electric connection of both terminals respectively provided to the first and second capacitors.

In the present invention, both ends of the first and second switches may be respectively connected to the first and second conductive lines.

In another aspect of the present invention, there is also provided a method for measuring a battery cell voltage using an isolation capacitor, including (a) selectively connecting both terminals of each cell included in a cell group of a battery to first and second conductive lines to primarily charge a cell voltage to a first voltage charging unit; (b) relaying the charged voltage stored in the first voltage charging unit to secondarily charge the voltage to a second voltage charging unit; (c) electrically isolating the first and second voltage charging units from each other; and (d) sensing the voltage charged to the second voltage charging unit to measure a cell voltage.

Preferably, the step (d) includes amplifying the voltage charged in the second voltage charging unit into an analog voltage signal; and converting the analog voltage signal into a digital voltage signal.

In the present invention, between the steps (c) and (d), the method may further include the step of discharging the voltage charged in the first voltage charging unit.

In the present invention, after the step (d), the method may further include the step of discharging the voltage charged in the second voltage charging unit.

Advantageous Effects

According to the present invention, since an isolation capacitor is interposed between a switching unit for selectively connecting each battery cell and a voltage sensing unit for sensing voltage in a voltage measuring circuit used for measuring voltage of a high voltage battery, the high voltage battery may be isolated from the voltage sensing unit, so it is possible to sense voltage of each battery cell included in the high voltage battery by using a part with low withstanding voltage. Also, since a device with low withstanding voltage is used, it is possible to greatly reduce a cost burden caused by a device with high withstanding voltage.

Figure 1:
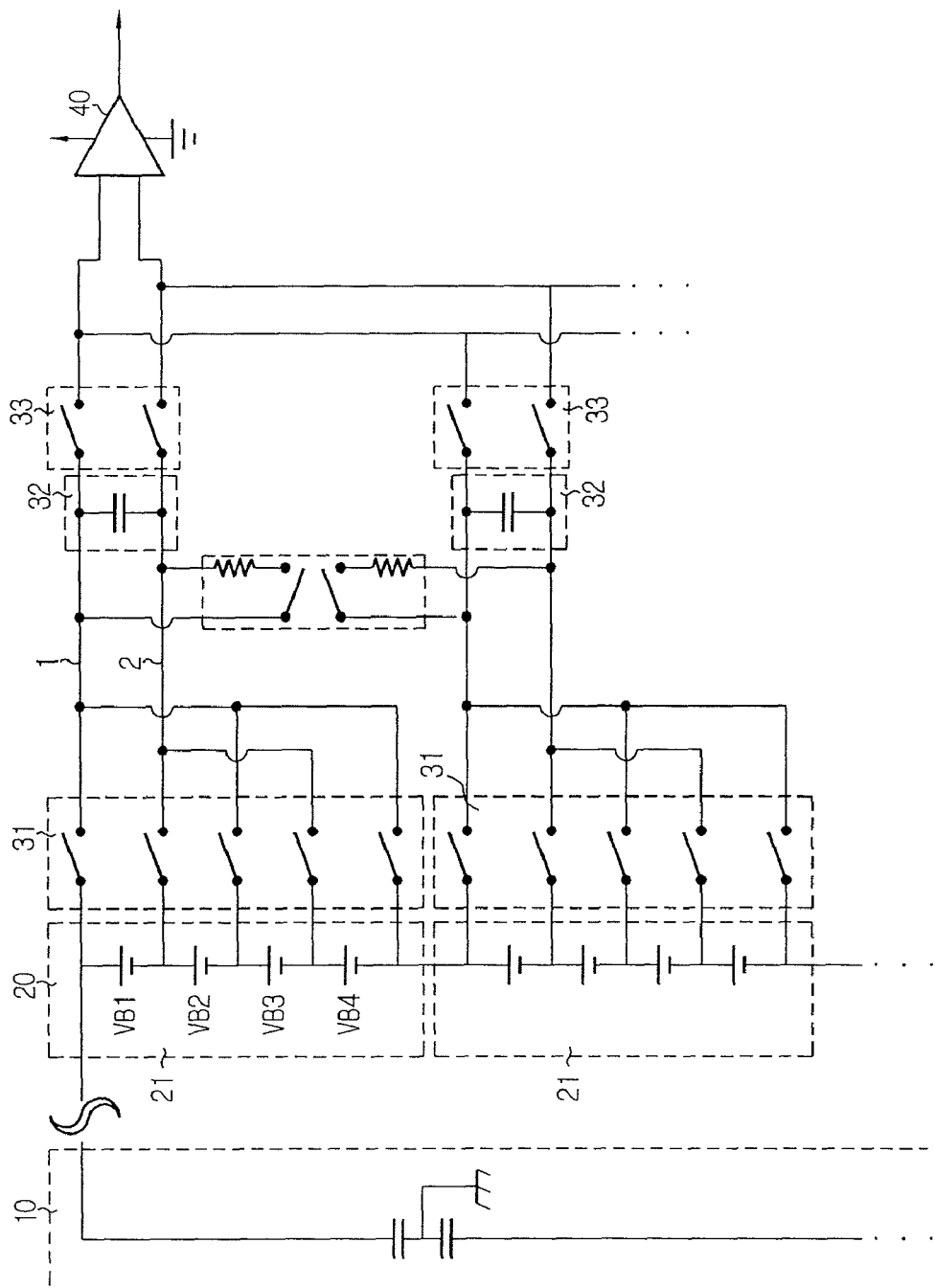
FIG. 1 is a circuit diagram showing a conventional apparatus for measuring a battery cell voltage.

| REFERENCE NUMERALS OF ESSENTIAL PARTS IN THE DRAWINGS | |
|---|---|
| 100: | load |
| 110: | Y-cap |
| 200: | battery |
| 210: | cell group |
| 310: | first switching unit |
| 320: | first voltage charging unit |
| 330: | second voltage charging unit |
| 340: | second switching unit |
| 350: | first discharging unit |
| 360: | second discharging unit |
| 400: | cell voltage sensing unit |
| 410: | voltage amplifier |
| 420: | A/D converter |
| 430: | controller |
| 431: | MCU |
| 432: | switch control module |
| 433: | memory |
| 434: | ROM |

BEST MODE FOR CARRYING OUT THE INVENTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 2:
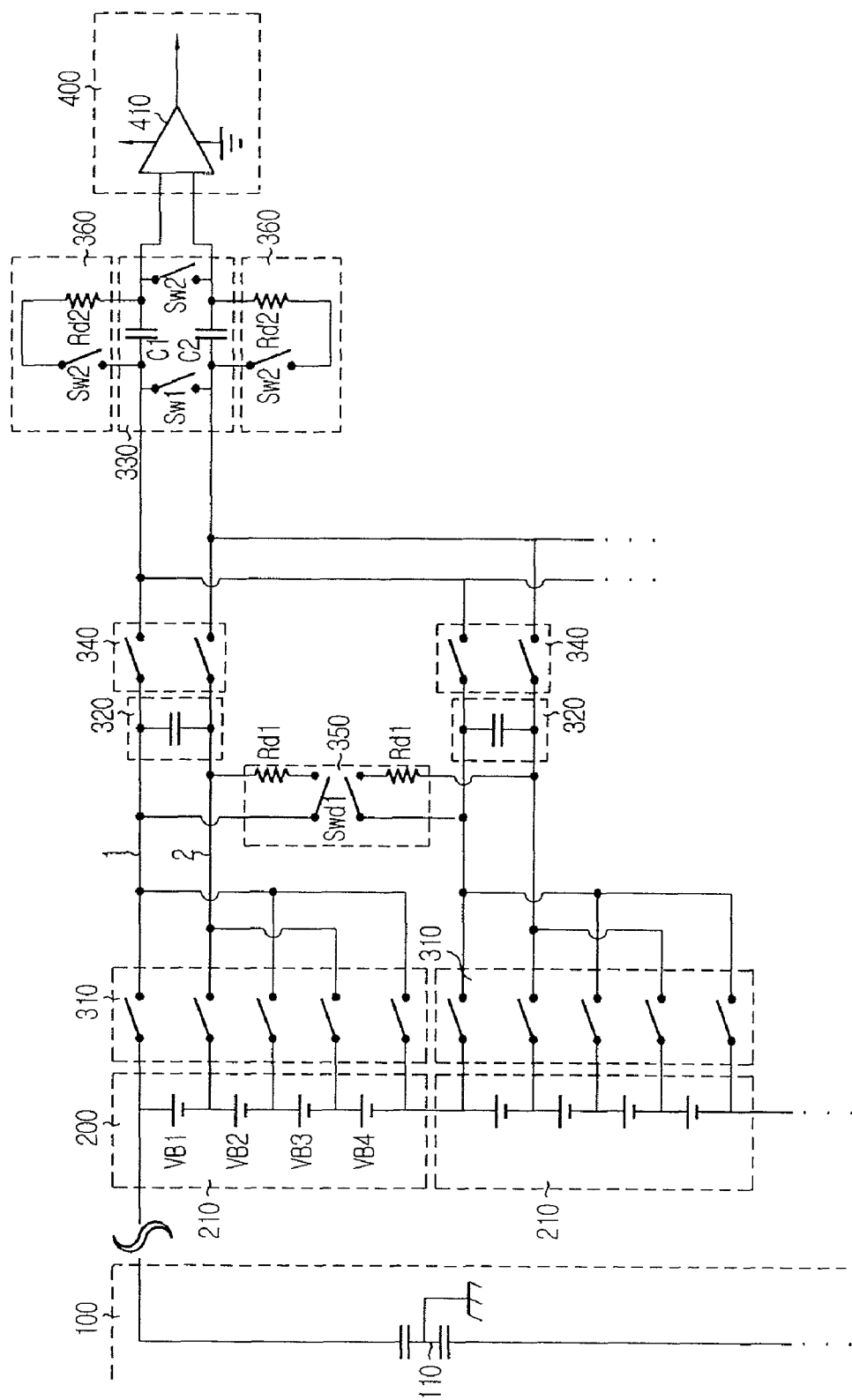
FIG. 2 is a circuit diagram showing an apparatus for measuring a battery cell voltage using an isolation capacitor according to a preferred embodiment of the present invention.
Figure 3:
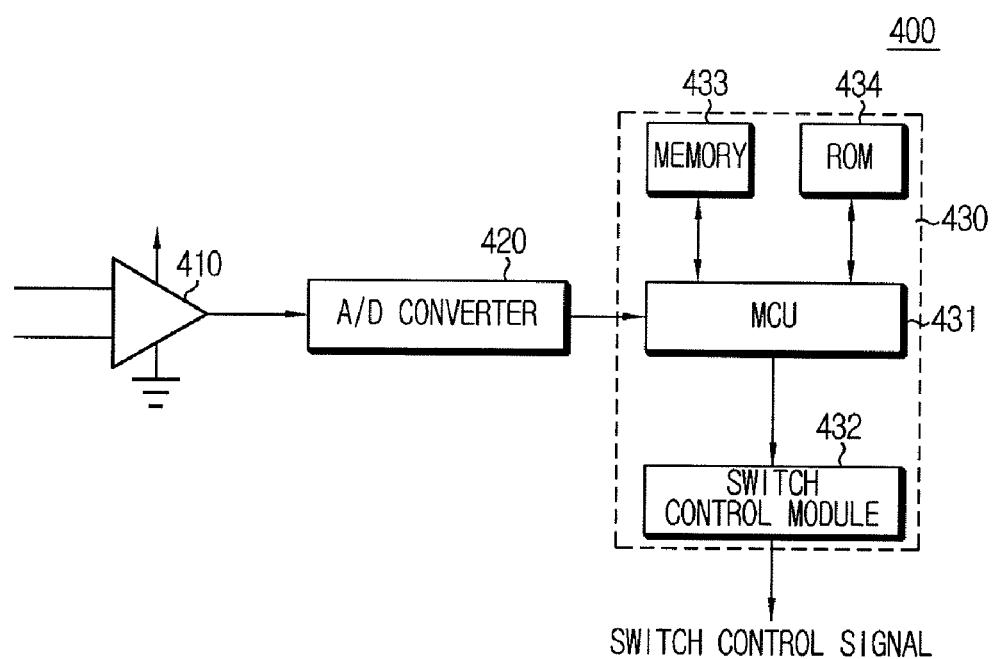
FIG. 3 is a block diagram showing a voltage sensing unit according to a preferred embodiment of the present invention.

FIG. 2 is a circuit diagram showing an apparatus for measuring a battery cell voltage using an isolation capacitor according to a preferred embodiment of the present invention, and FIG. 3 is a block diagram showing a voltage sensing unit according to a preferred embodiment of the present invention.

As shown in FIG. 2, the apparatus for measuring a battery cell voltage using an isolation capacitor (hereinafter, referred to as a battery cell voltage measuring apparatus) according to the present invention is electrically connected to a battery 200 having a cell group 210 for supplying power to a load 100 to sense a charged voltage of each battery cell VB1, VB2, VB3, VB4 included in the cell group 210.

The load 100 is a means using an electric energy output from the battery 200. The load 100 may be composed of a motor, a DC-to-DC converter and so on, in case of an electric or hybrid electric vehicle. Also, a Y-cap 110 is provided at the load 100 so as to prevent noise generated at the load from being applied toward the battery. The Y-cap 110 is composed of two capacitors connected in parallel to a high voltage terminal and a low voltage terminal, and a node between the capacitors is grounded.

The battery 200 is an electric energy storage means with the cell group 210 in which a plurality of rechargeable cells are electrically connected. The cell is a secondary battery such as a lithium ion battery, a lithium polymer battery, a nickel-cadmium battery, a nickel-hydrogen battery and a nickel-zinc battery.

The battery cell voltage measuring apparatus according to the present invention includes a first switching unit 310 electrically connected to the battery 200 having the cell group 210 to selectively connect both terminals of each battery cell VB1, VB2, VB3, VB4 to first and second conductive lines 1, 2; a first voltage charging unit 320 connected between the first and second conductive lines 1, 2 to primarily charge a charged voltage of each battery cell VB1, VB2, VB3, VB4; a second voltage charging unit 330 for relaying the charged voltage stored in the first voltage charging unit 320 such that the relayed voltage is secondarily charged to the second voltage charging unit 330; a second switching unit 340 installed between the first and second voltage charging units 320, 330 to connect the first and second voltage charging units 320, 330 with each other in the charged voltage relaying mode and isolating the first and second voltage charging units 320, 330 from each other in the charged voltage sensing mode; a first discharging unit 350 selectively connected to the first voltage charging unit 320 to discharge the charged voltage stored in the first voltage charging unit 320 after the relaying operation of charged voltage is completed; a second discharging unit 360 selectively connected to the second voltage charging unit 330 to discharge the charged voltage stored in the second voltage charging unit 330 after the charged voltage is completely sensed; and a cell voltage sensing unit 400 connected to the second voltage charging unit 330 to sense the charged voltage stored in the second voltage charging unit 330.

Here, the second voltage charging unit 330 includes a first capacitor C1 installed on the first conductive line 1, a second capacitor C2 installed on the second conductive line 2, a first switch SW1 installed between the first and second conductive lines 1, 2 at the side of the second switching unit 340 based on the first and second capacitors C1, C2, and a second switch SW2 installed between the first and second conductive lines 1, 2 at the side of the cell voltage sensing unit 400 based on the first and second capacitors C1, C2.

The second voltage charging unit 330 is positioned between each battery cell VB1, VB2, VB3, VB4 of the battery 200 and the cell voltage sensing unit 400. Accordingly, a direct electric connection between the cell voltage sensing unit 400 and the load 100 connected to the battery 200, grounded to a common ground, is intercepted, thereby realizing isolation between a battery region and a cell voltage sensing region. Thus, the battery cell voltage measuring apparatus according to the present invention may prevent a high voltage of the battery from being directly applied to the first and second switching units 310, 340, so it is possible to measure each cell voltage of a high voltage battery even using a part with low withstanding voltage.

In addition, the first discharging unit 350 includes a first discharge resistance Rd1 connected to the first voltage charging unit 320 through the first and second conductive lines 1, 2 and a first discharge switch SWd1 for controlling ON/OFF operation of the first discharge resistance Rd1. Also, the second discharging unit 360 includes two second discharge resistances Rd2 respectively connected to the first and second capacitors C1, C2 of the second voltage charging unit 330 and the first and second conductive lines 1, 2, and a second discharge switch SWd2 for controlling ON/OFF operation of the second discharge resistances Rd2.

As shown in FIG. 3, the cell voltage sensing unit 400 includes a voltage amplifier 410 connected to the second voltage charging unit 330 to sense the charged voltage stored in the second voltage charging unit 330 and thus output an analog voltage signal, an A/D converter 420 for converting the analog voltage signal output from the voltage amplifier 410 into a digital voltage signal, and a controller 430 for receiving the digital voltage signal converted through the A/D converter 420 to control overall operations required for storing a voltage value of each battery cell VB1, VB2, VB3, VB4 to a memory.

The controller 430 includes a MCU (Micro Controller Unit) 431 acting as a process for controlling overall operations of the battery cell voltage measuring apparatus of the present invention; a switch control module 432 for controlling ON/OFF operations of the switches provided at the first and second switching units 310, 340, the second voltage charging unit 330 and the first and second discharging units 350, 360; a memory 433 for storing a sensed voltage level of each battery cell VB1, VB2, VB3, VB4; and a ROM 434 in which a program for realizing the battery cell voltage measuring operation executed by the MCU 431 is recorded. Here, the memory 433 is an example of active memory, and the ROM 434 is an example of inactive memory. However, the present invention is not limited to the detailed kind of memory.

Operation modes of the battery cell voltage measuring apparatus according to the present invention include a charged voltage relaying mode at which voltage of each battery cell VB1, VB2, VB3, VB4 is stored in the first voltage charging unit 320 and then the charged voltage stored in the first voltage charging unit 320 is relayed to the second voltage charging unit 330; and a charged voltage sensing mode at which the charged voltage stored in the second voltage charging unit 330 is sensed.

In the charged voltage relaying mode, voltage of each battery cell VB1, VB2, VB3, VB4 included in the cell group 210 of the battery 200 is stored in the first voltage charging unit 320, and the charged voltage stored in the first voltage charging unit 320 is relayed to the second voltage charging unit 330. First, in case a charged voltage of a first battery cell VB1 of the cell group 210 is relayed, the controller 430 controls the switch control module 432 to turn off the second switching unit 340. Also, the controller 430 controls the first switching unit 310 to connect both terminals of the first battery cell VB1 to the first and second conductive lines 1, 2. Then, the voltage output from the first battery cell VB1 is stored in the first voltage charging unit 320. If the voltage of the first battery cell VB1 is completely charged to the first voltage charging unit 320, the controller controls the first switching unit 310 through the switch control module 432 to isolate the first battery cell VB1 from the first voltage charging unit 320. Also, the controller 430 turns on the second switch SW2 of the second voltage charging unit 330 and then turns on the second switching unit 340. Then, the first and second voltage charging units 320, 330 are connected with each other, so the charged voltage stored in the first voltage charging unit 320 is relayed to the first and second capacitors C1, C2 of the second voltage charging unit 330.

Meanwhile, if the charged voltage relaying mode is completed, the controller 430 controls the switch control module 432 to turn off the second switching unit 340 and turns on the first discharge switch SWd1 of the first discharging unit 350. Then, the charged voltage stored in the first voltage charging unit 320 is discharged through the first discharge resistance Rd1 of the first discharging unit 350, so the first voltage charging unit 320 is reset.

The charged voltage sensing mode is executed after the operations of the charged voltage relaying mode are completed. First, the controller 430 controls the switch control module 432 to turns off the second switching unit 340. Also, the controller 430 turns off the second switch SW2 of the second voltage charging unit 330 and then turns on the first switch SW1 to connect the first and second capacitors C1, C2 of the second voltage charging unit 330 with the voltage amplifier 410 of the cell voltage sensing unit 400. Then, the voltage amplifier 410 senses the charged voltage of the first battery cell VB1, stored in the first and second capacitors C1, C2. Here, if the charged voltage sensing mode is completed, the controller 430 controls the switch control module 432 to turns off the first switch SW1 of the second voltage charging unit 330.

After that, the controller 430 turns on the second discharge switch SWd2 of the second discharging unit 360 to discharge the charged voltage stored in the first and second capacitors C1, C2 through the second discharge resistance Rd2. Then, the second voltage charging unit 330 is reset into a status before a charged voltage of each battery cell is relayed.

Subsequently, the above charged voltage relaying mode and the charged voltage sensing mode are conducted for other battery cells in the substantially same way, thereby sensing voltage of each battery cell.

The analog voltage signal sensed at the voltage amplifier 410 of the cell voltage sensing unit 400 by means of the charged voltage relaying mode and the charged voltage sensing mode is input to the A/D converter 420 and converted into a digital voltage signal, and then the digital voltage signal is input to the MCU 431 of the controller 430. The MCU 431 stores the input digital voltage signal of each battery cell VB1, VB2, VB3, VB4 in the memory 433. Then, the voltage sensing process for each battery cell VB1, VB2, VB3, VB4 is completed.

It would be apparent to those having ordinary skill in the art that the process of sensing voltage for each battery cell VB1, VB2, VB3, VB4 is repeated at regular cycles.

Figure 4:
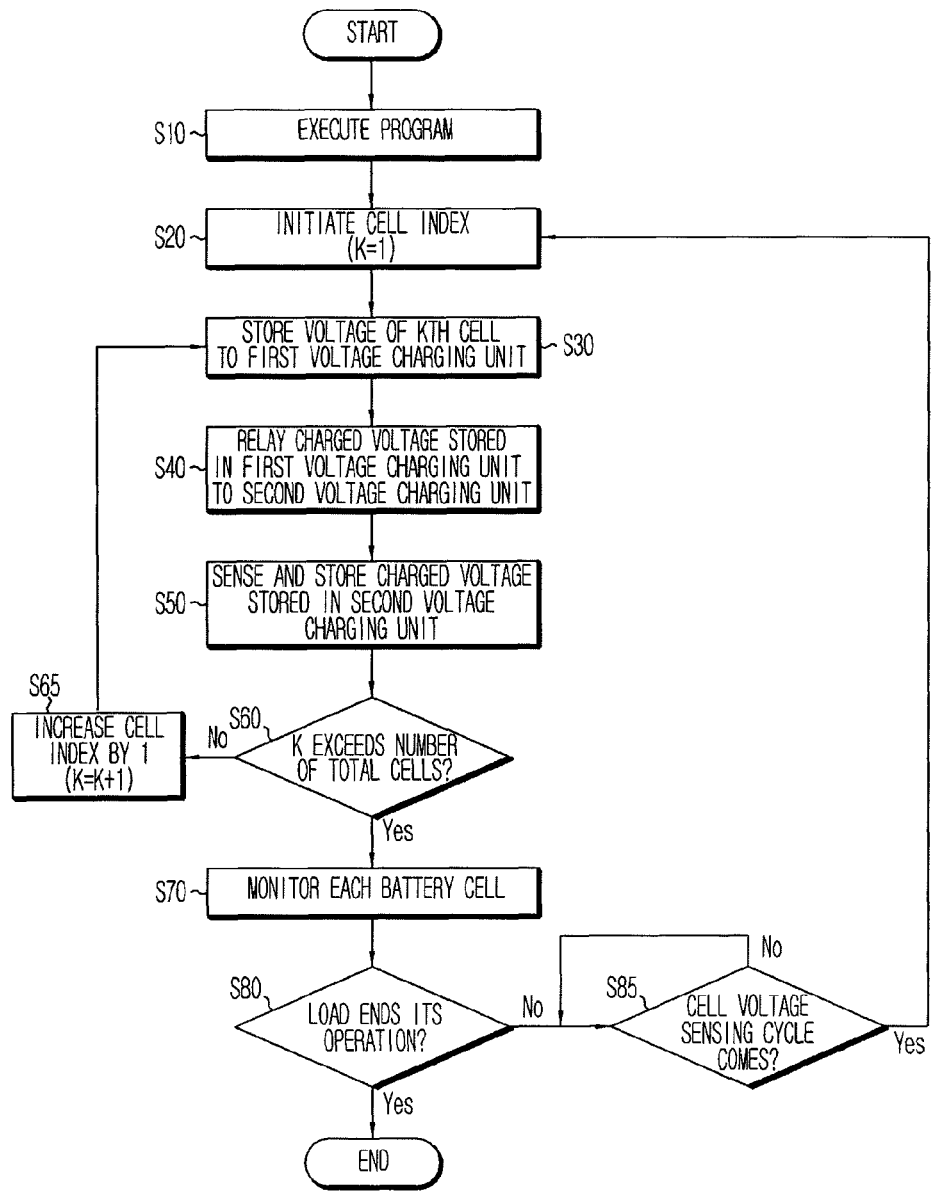
FIG. 4 is a flowchart illustrating a method for measuring a battery cell voltage according to a preferred embodiment of the present invention.

FIG. 4 is a flowchart illustrating a method for measuring a battery cell voltage according to a preferred embodiment of the present invention.

First, in the step S10, the controller 430 executes the battery cell voltage sensing program recorded in the ROM 434 by means of the MCU 431.

In the step S20, the controller endows a cell index K to each battery cell VB1, VB2, VB3, VB4 so as to subsequently sense a charged voltage of each battery cell VB1, VB2, VB3, VB4, and initiates the cell index K into 1.

In the step S30, the controller 430 turns off the second switching unit 340 and controls the first switching unit 310 to connect both terminals of a $K^{th}$ battery cell (currently K is 1) to the first and second conductive lines 1, 2. Then, the $K^{th}$ battery cell is electrically connected to the first voltage charging unit 320, so the charged voltage of the $K^{th}$ battery cell is stored in the first voltage charging unit 320.

In the step S40, the controller 430 turns on the second switching unit 340 to connect the first voltage charging unit 320 with the second voltage charging unit 330, and also controls the first switching unit 310 to disconnect both terminals of the $K^{th}$ battery cell from the first and second conductive lines 1, 2. In addition, the controller 430 turns on the second switch SW2 of the second voltage charging unit 330. Then, the first voltage charging unit 320 is electrically connected with the second voltage charging unit 330, and the charged voltage stored in the first voltage charging unit 320 is relayed to the second voltage charging unit 330.

In the step S50, the controller 430 turns off the second switching unit 340. Also, the controller 430 turns off the second switch SW2 of the second voltage charging unit 330 and turns on the first switch SW1. Then, the second voltage charging unit 330 is electrically connected to the voltage amplifier 410, so the charged voltage stored in the second voltage charging unit 330 is amplified by means of the voltage amplifier 410 and then output as an analog voltage signal. The output analog voltage signal is input to the A/D converter 420 and converted into a digital voltage signal. The converted digital voltage signal is input to the MCU 431 and stored in the memory 433.

Meanwhile, when the charged voltage relaying operation is completed in the Steps S40 and S50 and also the second switching unit 340 is turned off, the controller 430 turns on the first discharge switch SWd1 of the first discharging unit 350 to discharge the charged voltage stored in the first voltage charging unit 320 through the first discharge resistance Rd1, thereby resetting the first voltage charging unit 320. Also, when the charged voltage sensing operation is completed, the controller 430 turns off the first switch SW1 of the second voltage charging unit 330 and then turns on the second discharge switch SWd2 of the second discharging unit 360 to discharge the charged voltage stored in the second voltage charging unit 330, thereby resetting the second voltage charging unit 330.

In the step S60, the controller determines whether the cell index K exceeds the number of total cells included in the battery 200.

The step S65 is executed when the cell index K does not exceed the number of total cells included in the battery 200. In the step S65, the controller 430 returns the process to the step S30 while increasing the cell index K by 1. After that, the controller 430 repeatedly executes the steps S30 to S60 until the cell index K exceeds the number of total cells included in the battery 200, thereby sensing a charged voltage of each battery cell VB1, VB2, VB3, VB4 and storing the charged voltage into the memory 433

The step S70 is executed when the cell index K exceeds the number of total cells included in the battery 200. In the step S70, the controller 430 monitors the charged voltage of each battery cell VB1, VB2, VB3, VB4 stored in the memory 433 and then controls charging/discharging of each battery cell VB1, VB2, VB3, VB4 as required.

In the step S80, the controller 430 determines whether the load using electric energy output from the battery 200 stops its operation. If it is determined that the load stops its operation in the step S80, the controller 430 ends the above battery cell voltage measuring process. Meanwhile, if it is determined that the load keeps operating in the step S80, the controller 430 executes the step S85.

In the step S85, the controller 430 determines whether a cell voltage sensing cycle comes, and then, if the cell voltage sensing cycle comes, the controller 430 returns the process to the step S20. After that, the controller 430 repeats the charged voltage sensing and monitoring processes again for each battery cell.

It is apparent to those having ordinary skill in the art that the above steps S10 to S85 are repeatedly executed at regular cycles while the battery is used.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for measuring a battery cell voltage, comprising:
a first voltage charging unit for primarily charging a cell voltage;
a second voltage charging unit having an isolation capacitor and electrically connected or disconnected to/from the first voltage charging unit for relaying the charged voltage discharged from the first voltage charging unit such that the relayed voltage is secondarily charged to the isolation capacitor of the second voltage charging unit;

a switching unit for connecting the first and second voltage charging units in a charged voltage relaying mode and isolating the first and second voltage charging units from each other in a charged voltage sensing mode; and a cell voltage sensing unit for sensing the voltage charged in the second voltage charging unit while the first and second voltage charging units are isolated from each other in the charged voltage sensing mode.

2. The apparatus for measuring a battery cell voltage according to claim 1, wherein the cell voltage sensing unit includes:

a voltage amplifier for amplifying the voltage charged in the second voltage charging unit to output the amplified voltage as an analog voltage signal;

an A/D (Alternating/Direct) converter for receiving the output analog voltage signal to convert the analog voltage signal into a digital voltage signal and output the digital voltage signal; and a controller for receiving the converted digital voltage signal to monitor a voltage of the battery cell, and controlling overall operations of first and second switching units.

3. The apparatus for measuring a battery cell voltage according to claim 1, further comprising a first discharging unit connected to the first voltage charging unit to discharge the charged voltage stored in the first voltage charging unit after the charged voltage stored in the first voltage charging unit is completely relayed to the second voltage charging unit.

4. The apparatus for measuring a battery cell voltage according to claim 3, wherein the first discharging unit has a discharge resistance connected to the first voltage charging unit through a conductive line and a switch for controlling ON/OFF operation of the discharge resistance.

5. The apparatus for measuring a battery cell voltage according to claim 1, further comprising a second discharging unit connected to the second voltage charging unit to discharge the charged voltage stored in the second voltage charging unit after the charged voltage is completely sensed.

6. The apparatus for measuring a battery cell voltage according to claim 5, wherein the second discharging unit has a discharge resistance connected to the second voltage charging unit through a conductive line and a switch for controlling ON/OFF operation of the discharge resistance.

7. The apparatus for measuring a battery cell voltage according to claim 1, wherein the isolation capacitor of the second voltage charging unit includes first and second capacitors respectively installed on conductive lines at both terminals of the first voltage charging unit, and wherein the second voltage charging unit includes first and second switches for turning on/off an electric connection of both terminals respectively provided to the first and second capacitors.

8. The apparatus for measuring a battery cell voltage according to claim 7, wherein both ends of the first and second switches are respectively connected to the conductive lines at both terminals of the first voltage charging unit.

9. The apparatus for measuring a battery cell voltage according to claim 1, further comprising:

a battery having a cell group;

first and second conductive lines respectively connected to both terminals of each battery cell of the cell group; and an additional switching unit for connecting or disconnecting both terminals of each battery cell of the cell group to/from the first and second conductive lines, wherein the first voltage charging unit is connected between the first and second conductive lines.

10. The apparatus for measuring a battery cell voltage according to claim 9, wherein the isolation capacitor of the second voltage charging unit includes first and second capacitors respectively installed on the first and second conductive lines, and wherein the second voltage charging unit includes first and second switches for turning on/off an electric connection of both terminals respectively provided to the first and second capacitors.

11. The apparatus for measuring a battery cell voltage according to claim 10, wherein both ends of the first and second switches are respectively connected to the first and second conductive lines.

12. A system, comprising:

a battery;

a load connected to the battery; and an apparatus for measuring a battery cell voltage according to claim 1.

13. A method for measuring a battery cell voltage, comprising:

(a) primarily charging a cell voltage to a first voltage charging unit;

(b) electrically connecting the first voltage charging unit to a second voltage charging unit to relay the charged voltage discharged from the first voltage charging unit to an isolation capacitor of the voltage charging unit to secondarily charge the voltage;

(c) electrically isolating the first and second voltage charging units from each other; and (d) sensing the voltage charged to the second voltage charging unit to measure a cell voltage, while the first and second voltage charging units are isolated from each other.

14. The method for measuring a battery cell voltage according to claim 13, wherein the step (d) includes:

amplifying the voltage charged in the second voltage charging unit and outputting the amplified voltage as an analog voltage signal; and converting the analog voltage signal into a digital voltage signal.

15. The method for measuring a battery cell voltage according to claim 13, between the steps (c) and (d), further comprising:

discharging the voltage charged in the first voltage charging unit.

16. The method for measuring a battery cell voltage according to claim 13, after the step (d), further comprising:

discharging the voltage charged in the second voltage charging unit.

17. The method for measuring a battery cell voltage according to claim 13, wherein, in the step (a), both terminals of each cell included in a cell group of a battery are connected to first and second conductive lines so that a cell voltage is charged to the first voltage charging unit.

* * * * *